(12) United States Patent
Knadle (10) Patent No.: US 7,129,732 B1
(45) Date of Patent: Oct. 31, 2006

(54) SUBSTRATE TEST APPARATUS AND METHOD OF TESTING SUBSTRATES

(75) Inventor: Kevin T. Knadle, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/281,456

(22) Filed: Nov. 18, 2005

(51) Int. Cl.
*G01R 31/02* (2006.01)
*H05K 7/00* (2006.01)

(52) U.S. Cl. ............. 324/760; 361/688; 361/796; 361/831

(58) Field of Classification Search .............. None
See application file for complete search history.

(56) References Cited

U.S. PATENT DOCUMENTS

| | | | |
|---|---|---|---|
| 3,808,532 A * | 4/1974 | Yuska | 324/755 |
| 4,510,446 A | 4/1985 | Braun et al. | |
| 4,724,383 A * | 2/1988 | Hart | 324/754 |
| 5,072,177 A * | 12/1991 | Liken et al. | 324/760 |
| 5,172,063 A | 12/1992 | Munikoti et al. | |
| 5,198,756 A | 3/1993 | Jenkins et al. | |
| 5,325,068 A | 6/1994 | Rauf | |
| 5,392,219 A | 2/1995 | Birch et al. | |
| 5,701,667 A | 12/1997 | Birch et al. | |
| 6,175,498 B1 * | 1/2001 | Conroy et al. | 361/704 |
| 6,521,841 B1 | 2/2003 | Kawaguchi | |
| 6,711,961 B1 * | 3/2004 | Theriault et al. | 73/865.6 |
| 6,714,419 B1 * | 3/2004 | Liken et al. | 361/752 |
| 6,984,974 B1 * | 1/2006 | Liken et al. | 324/158.1 |
| 2003/0112025 A1 * | 6/2003 | Hamilton et al. | 324/760 |

OTHER PUBLICATIONS

"DC Current Induced Thermal Cycling Test", by IPC (2215 Sanders road, Northbrook IL 60062-6135) No. 2.6.26, Nov. 1999, Four pages.*
"A New Power Cycling Technique For Accelerated Reliability Evaluation of Plated Through Holes and Interconnects in PCB's", IEEE Transaction On Components, Hybrids, And Manufacturing Technology, vol. 13, No. 4, Dec. 1990, pp. 865-872.
"Thermal Stress—Power Cycling Method", Author Unknown, Dec. 3, 1992, 6 pages.
"IPC-TM-650 Test Methods Manual", IPC Associated Connection Electronics Industries, May 2001 (only two pages).

* cited by examiner

*Primary Examiner*—Paresh Patel
(74) *Attorney, Agent, or Firm*—Hinman, Howard & Kattell, LLP; Lawrence R. Fraley (57) ABSTRACT

A test apparatus for testing circuitized substrates such as PCB test coupons for thru-hole failure in which the substrate may be cooled to a temperature less than the ambient temperature surrounding the test apparatus housing in which the testing is accomplished. A method of testing substrates is also provided.

15 Claims, 3 Drawing Sheets

SUBSTRATE TEST APPARATUS AND METHOD OF TESTING SUBSTRATES

TECHNICAL FIELD

This invention relates to test apparatus and particularly to test apparatus for testing circuitized substrates such as test coupons for printed circuit boards and the like products.

BACKGROUND OF THE INVENTION

Today's miniaturization requirements for organic circuitized substrates, including multilayered printed circuit boards (PCBs), laminate chip carriers, and the like, require the formation of multiple circuits in a minimum volume or space. These circuits typically comprise a stack of electrically conductive copper or copper alloy layers of signal, ground and/or power planes (lines) separated from each other by a layer of organic dielectric material, typically fiber-glass reinforce resin material known in the art commonly as "FR4." Selected lines or pads of one conductive layer are often in electrical contact with selected lines and/or pads of other conductive layers using plated holes passing through the dielectric layers. The plated holes are often referred to as "buried vias" if internally located, "blind vias" if extending a predetermined depth within the board from an external surface, or "plated-thru-holes" (PTHs) if extending substantially through the board's full thickness. By the term "thru-hole" as used herein is meant to include all three types of such substrate openings.

Before placing a given circuitized substrate through the component assembly operation, it is desirable to test the substrate, including the electrical interconnection integrity thereof, to determine whether it is able to withstand the thermal/mechanical stresses experienced during the actual manufacturing assembly process and the product's end use environment. There are presently a number of accelerated stress test methods by which substrates are tested, with each test generally designed to simulate, usually in an accelerated manner, a particular stress that would cause deterioration resulting during the assembly and natural end use conditions of the substrate. In general, these accelerated stress tests involve some element of heat, humidity, or cycling between temperature extremes, and accordingly, will artificially reproduce and hasten inherent failure modes within the tested substrate. One common type of such stress tests is the accelerated thermal cycle, also referred to as "ATC", in which the substrate is exposed to multiple cycles of hot and cold extremes. ATC tests have the effect of mechanically straining the layers of the substrate and the thru-hole interconnections (also referred to simply as interconnects) by means of repeated cycles of thermal expansion and contraction, such as occurs during assembly cycles, product on-off cycles, and outdoor environmental temperature changes. Accordingly, in ATC tests, latent defects in the board will be revealed as the cyclic stressing mechanically exercises any weak or defective element to failure. When such ATC fatigue cycling is performed on an accelerated basis, relative to what is normally experienced in manufacturing assembly and in the field, reliability predictions relating to the substrate can be derived from the test.

Various methods of performing accelerated thermal cycle tests involve the use of a specific test "coupon", which is typically a smaller substrate (e.g., a small PCB) which can be manufactured in replicate on its own test vehicle panel, or can be manufactured concurrently on a larger product PCB, but solely for test purposes. Test coupons that are manufactured as an integral part of the actual product substrate are therefore subject to the same manufacturing conditions and processes as the larger substrate (e.g., PCB) with which the coupons are associated. Therefore, the quality of a given test coupon can be a reliable indication of the quality of its associated, larger substrate.

One ATC thermal test procedure using test coupons involves thermally cycling the test coupon by repeated exposure to hot and cold air to both heat and cool the coupon. This particular approach has been endorsed as the benchmark standard by the Institute for Interconnecting and Packaging Electronic Circuits ("IPC"). The industry standard method has been published in Mil-Standard 202F, Method 107G (also referred to in the industry simply as "Mil-T"). Although Mil-T cycling is presently sanctioned by IPC, there are a number of known drawbacks to this approach, particularly for PCB's. For example, a complete test of a given coupon may take as long as forty days for the coupon to be processed through the one hundred to one thousand cycles necessary to simulate expected life usage. Further, the operation of a Mil-T chamber can be expensive insofar as the chilled portion of the chamber typically relies upon liquid nitrogen, which is costly to ship, store, and use, and which presents certain environmental concerns. Chamber testing is further limited by the maximum high temperature, which is typically 175C, thus not allowing direct evaluation of assembly temperature cycles from assembly, which are typically at least 220C.

Variations on air-to-air chamber testing have also been developed specifically for small test coupons to increase the rate of temperature cycling, and thus decrease the total test time. One such test unit is referred to as "HATS", or "Highly Accelerated Test System", one known company providing such a system under this name being Integrated Reliability Test Systems, Inc., of Anaheim, Calif. The HATS system is capable of cycling coupons between –60 to 160 degrees C. and achieves faster cycling than conventional chambers due to more efficient exchange between hot and cold air, though the relatively low efficiency of heat transfer in air still limits the actual rate of coupon cycling. One publication listed 10.6 minute cycles (about 6 cycles per hour) as the cycle rate for a –40 to 145 degrees C. test. As with other chamber cycle tests, a maximum high temperature of 160 degrees C. limits the range of cycling possible, especially to represent assembly reflow temperatures. The inability to stress coupons with a reflow cycle with HATS, or other air to air chamber tests, has at least two consequences. First, direct comparisons of cycle to fail data between cold cycling and reflow cycling on the same coupon design is not possible. Second, in the common situation where some number of reflow cycles is required as preconditioning prior to a cold cycle stress test, those reflow cycles must be performed in a separate reflow oven.

Other substrate testing approaches have also been developed. Wet thermal shock is one, in which substrates are cyclically immersed in cold and hot liquids. This approach is fast due to the increased efficiency of heat transfer in the liquid. However, drawbacks of the wet thermal shock are that the cycle is uncontrolled during the hot and cold immersions, so that rate of change is a function of sample mass. Accordingly, results are sometimes not repeatable. Further, wet thermal shock does not facilitate continuous electrical monitoring during the cycling, and, as with chamber cycling, is also limited to a high temperature of less than 175 degrees C. Another method heats and cools the test coupon by exposing it to a fluidized sand bath. This method is awkward to use and maintain, and is typically limited to a low temperature of 50 degrees C. Yet another method is referred to as the "Power Cycling Technique" ("PCT"), or, more recently, as "Current Induced Thermal Cycling". Through this method, direct current (DC) is passed through the coupon, which causes the coupon to heat up, so that the substrate is thermally stressed. A variation of this testing procedure is referred to as an "Interconnect Stress Test" (IST), one known company referring to such testing by this name being Digital Equipment Corporation of Maynard, Mass. Current Induced Thermal Cycle methods can achieve cycle rates as fast as 10 to 30 cycles per hour because the heat is generated internally within the coupon and therefore is not dependent on heat transfer through an external medium such as air or liquid, at least for the heat up part of the cycle. Temperatures up to and above assembly reflow conditions are also easily attained.

As defined herein, the present invention involves the use of a test coupon which is subjected to thermal testing through the application of DC current to the coupon to raise and lower its temperature to the extent that the thru-holes and the interconnects thereof (e.g., between the thru-hole and the adjacent conductor lines, islands or planes) are sufficiently thermally stressed to thereby enable the tester to determine if said thru-holes and associated connecting structures (e.g., adjacent "lands") will successfully withstand the same conditions which corresponding larger substrates will be subjected to. It has been found that a main cause of thru-hole failure may be traced to significant differences in thermal expansion between the copper or other metal plating which lines the thru-hole and the surrounding substrate dielectric material (e.g., the aforementioned "FR4" material), which have significantly different coefficients of thermal expansion. When the differential expansion causes strain that exceeds the strength of the copper thru-hole plated material, a rupture intermediate the ends of the thru-hole structure may develop due to the thermal stresses generated. This undesirable occurrence may result in one or more open circuits or intermittent contacts which in turn may lead to failure of the substrate and any system in which it is utilized.

A particular problem associated with such DC voltage thermal testing is the inability to satisfactorily test each coupon across as wide temperature range to which the associated larger substrate will be eventually exposed. Present current induced thermal testing typically uses ambient temperature as the coolest temperature surrounding the test coupon, allowing the current applied through the test coupon to raise the coupon to a predetermined elevated higher temperature. Because many substrates may be required to operate at significantly lower temperatures as well as at much higher temperatures for the lowest operating temperature, testing coupons at ranges where ambient temperature is the only "low" temperature is limited. The present invention overcomes this limitation and is considered a significant advancement in the art. The following patents, all of which are incorporated herein by reference, represent various structures and methods used in testing coupons and the like.

In U.S. Pat. No. 6,521,841 (Kawaguchi), there is described a test coupon used to evaluate characteristics of multi-layer printed circuit boards. The coupon includes a multi-layer substrate which has at least first and second wiring layers. The first and second wiring layers are configured to correspond to a tested wiring layer and another wiring layer of the multi-layer printed circuit boards, respectively. Each of first and second thru-hole groups has a plurality of thru-holes which pass through the multi-layer substrate and which are arranged in an arranging direction. First and second conductor patterns provided on the first and second wiring layers, respectively, extend substantially along the arranging direction In U.S. Pat. No. 5,701,667 (Birch et al), there is described an Interconnect Stress Testing (IST) system and a printed wiring board test coupon which is used with the IST system. The system includes a computer device and a cabinet which is used for mounting the test coupon as well as housing a number of the other components that make up the system. During a pre-cycling phase, the system determines the correct current that should be passed through the coupon in order to heat it to a predetermined temperature. After that test current value is determined, the system stress tests the coupon by passing the determined test current through the coupon. It does so for a selected number of cycles, and monitors resistance changes in the coupon during testing while recording test data. This patent also describes the test coupon, which is designed to allegedly uniformly dissipate the heat created during the stress cycling. The above system is also described in U.S. Pat. No. 5,392,219 (Birch et al), a divisional of U.S. Pat. No. 5,701,667.

In U.S. Pat. No. 5,325,068 (Rauf), the electrical resistance of specimens formed on test coupons is measured when a test voltage applied to each specimen yields a leakage current. An operational amplifier having very high impedance inputs receives the leakage current signal and generates an output voltage that is low in magnitude and varies in the leakage current. The test voltage is applied to a plurality of specimens and leakage current from each specimen is simultaneously converted by operational amplifiers whose low impedance outputs are applied through switches in a sequential fashion to an analog to digital converter whose output is fed to a central processing unit wherein the leakage current is computed in terms of the resistance of the electrical insulation under examination.

In U.S. Pat. No. 5,198,756 (Jenkins et al), there is described a wiring test system in which test probes are oriented to engage contact points on a production circuit board. The system includes a wiring integrity verification plate comprising, in combination, a thin insulative base plate, multiple contact pads and leads attached to the plate. Each of the leads extends between and interconnects two of the contact pads, whereby multiple circuit sections are formed on the board. Each circuit section includes two pads interconnected by a lead, these two pads located so as to be contacted by the probes of the wiring test system to provide an electrical continuity test.

In U.S. Pat. No. 5,172,063 (Munikoto et al), the reliability of conductive circuitry of a printed circuit board and particularly the integrity of the conductive barrels of the board's through-holes is tested by cyclically passing a current through a plurality of interconnected barrels. The current is sufficient to resistively heat the conductive barrels to a temperature at which the glass epoxy substrate adjacent each barrel reaches a transition temperature at which the glass epoxy changes state from a solid to a semi-solid. After sufficiently heating the glass epoxy, it is allowed to cool to ambient temperature. This cycle is repeated for a predetermined number of cycles and the resistance of the barrels is measured after each cycle. A measured resistance that exceeds a predetermined value indicates that one or more defects are present in the interconnected barrels.

U.S. Pat. No. 4,510,446 (Braun et al), there is described a test coupons having predetermined respective test patterns, formed in a multilayer printed circuit board simultaneously with the fabrication of the latter. The test coupons are probed with conventional electrical instruments to provide information as to the occurrence of a misregistration of any given subsurface printed plane or trace, whether or not the misregistration exceeds a specified limit, and if desired, a measure of the degree of misregistration. The foregoing is allegedly accomplished in a timely manner without the need for cross-sectioning portions of the board and the visual observation of the subsurface printed layers.

The present invention allows the substrate test operator, in which current is induced into the substrate, to select a "low" ambient temperature lower than that surrounding the apparatus housing and then test the various substrates using this temperature as the base. As mentioned, heretofore, such testing was usually conducted with an initial room temperature ambient temperature, thereby limiting the test to only said temperature as the "low" ambient. Because substrates such as PCBs very often operate at much lower ambient temperatures (e.g., during automotive and military applications), a room temperature ambient as the initial temperature is deemed unsatisfactory to fully evaluate a substrate's end use conditions. A test system capable of both very hot and very cold cycling on the same coupon provides at least two significant advantages. First, in a single test setup, the very same coupon can be exposed to a number of high temperature reflow cycles as a precondition, and then tested to failure at a different cycle to very cold temperatures. Secondly, sets of coupons such as different cells in a designed experiment can be tested to failure at very different test conditions for direct comparison on the same coupon design and test system. That is, one cell of a particular coupon can be tested to failure at a cycle from ambient to reflow conditions, while a second cell of the same coupon can be tested to failure at a cold cycle representative of extreme use conditions, both using the same test system. Techniques of acceleration modeling can then be used to quantify the relative fatigue damage and other affects of a reflow cycle vs. a field cycle. It is therefore believed that an apparatus and associated method for providing low temperatures other than ambient for this type of testing, in combination with the intrinsic fast cycle rates and the ability to also test to very high reflow temperatures on the very same coupon, will represent significant advancements in the art.

OBJECTS AND SUMMARY OF THE INVENTION

It is, therefore, a primary object of the invention to enhance the art of substrate testing.

It is another object of the invention to provide an apparatus for testing substrates such as test coupons in which temperatures lower than ambient can be established as part of the testing procedure.

It is another object of the invention to provide an apparatus for testing substrates such as test coupons in which the same coupon can be tested at both very high and very low temperatures.

It is yet another object of the invention to provide such an apparatus which can be manufactured at relatively low cost and can be operated in a relatively easy manner.

It is still another object of the invention to provide a method of testing substrates such as test coupons in which the testing can be done in a relatively quick and expeditious manner.

According to one aspect of the invention, there is provided an apparatus for testing substrates, the apparatus comprising a housing including first and second chambers, at least one test fixture positioned within the first chamber and adapted for holding at least one test substrate having a plurality of conductive thru-holes therein and for being electrically coupled thereto, cooling structure for directing cooling fluid onto the test fixture when the fixture is holding the test substrate so as to cool the substrate to a first test temperature lower than the ambient temperature surrounding the housing, and electrical supply means for supplying electrical current to the test fixture and plurality of thru-holes within the test substrate to heat the test substrate.

According to another aspect of the invention, there is provided a method of testing substrates comprising positioning at least one test substrate having a plurality of conductive thru-holes therein within a test fixture positioned substantially within a first chamber of a housing including first and second chambers, electrically coupling the plurality of conductive thru-holes within the test substrate to the test fixture, directing cooling fluid onto both the test fixture and the test substrate when the test substrate is positioned within the test fixture so as to cool the test substrate to a first test temperature lower than the ambient temperature surrounding said housing, and supplying electrical current to the test fixture and plurality of thru-holes within the test substrate to heat the test substrate.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

Figure 1:
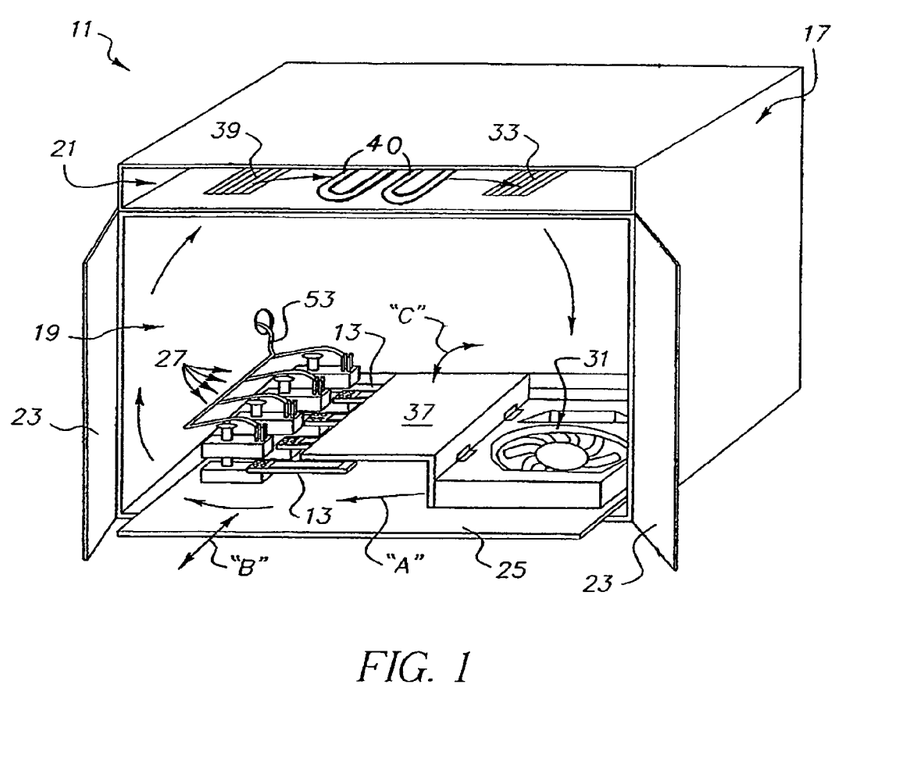
FIG. 1 is a perspective view, on a reduced scale, showing a substrate testing apparatus according to one embodiment of the invention.

In FIG. 1 (compare also FIG. 3), there is shown a test apparatus 11 according to one embodiment of the invention. Apparatus 11 is designed for testing at least one (and preferably several, four being shown in FIG. 1) test substrates 13 when positioned therein. In one example, test substrate 13 is a "test coupon" integrally manufactured and processed together with a related, much larger PCB (not shown). Generally speaking, apparatus 11 (and the associated test system described herein-below) tests the coupon by thermally cycling it by first running electric DC current through the daisy-chained thru-holes (located in an area 15 (FIG. 2) but not shown individually) of the coupon and then allowing/causing the coupon to cool to its original temperature. During the expansion and contraction of the coupon which occurs as a result of the cycling, the coupon is monitored by the system taught herein in order to accumulate information relating to the changes in the resistance of the coupon through the temperature range. Such information can then be used to indicate the expected useful life of the associated PCB with regard to the interconnect integrity thereof. Before directing current through the coupon, however, the coupon's temperature must be measured at a first "low" temperature and the current there-after applied causing the coupon to in turn increase in temperature to a second, higher temperature. A particular problem with previous test apparatus and systems has been that such apparatus and systems normally begin testing (current application) when the coupon is at ambient temperature, usually room temperature. As mentioned, this does not enable precise and representative measurements and a final decisive conclusion to be reached for the coupon (and its associated larger PCB) should the PCB be required to operate in relatively harsh environments such as those experienced in the automotive and military fields where temperatures often range much lower and even higher.

Apparatus 11 uniquely enables the establishment of a first test temperature different than normal ambient room temperatures (usually 23 degrees C.). Equally significant, this first temperature may be much lower than said normal ambient temperatures. In one embodiment of the invention, substrate 13 may be cooled to as low as −65 degrees Celsius (C.), if required. Once this temperature is reached, electrical current is applied across the substrate, and readings are taken (see more below). It is understood that the invention is not limited to "low" temperatures below normal ambient, because, as taught herein, the initial test temperature of the test coupon may be as high as approximately 150 degrees C. Understandably, readings taken when such test coupons are at temperatures more closely approximating those which the associated PCBS will encounter in use provide a more accurate determination of whether the PCBS will successfully function in such environments.

Apparatus 11, as illustrated in FIG. 1, includes a housing 17 with a first, lower chamber 19 and a second, upper chamber 21. Housing 17 is preferably of rigid construction and may include sheet metal or the like side panels to enclose the contents therein. Two doors 23 open to allow access to the first chamber 19. Upper chamber 21 is not normally accessed, except for servicing, and is covered by a front plate that is screwed in place (the front plate over chamber 21 being removed in the drawings for illustration purposes). A movable (slidable) base 25 is adapted for being withdrawn from the housing to facilitate coupon (substrate 13) positioning within designated test fixtures 27 (see also FIG. 2), mounted on the movable base. Base 25 movement is represented by the arrow "B." Each test fixture 27 receives current from a power supply (not shown) located within a second housing 29 (FIG. 3) which houses a test system to which apparatus 11 is operatively coupled. This system is described in greater detail herein-below with respect to FIG. 3. At least one electrically driven fan 31 is also positioned on base 25, the purpose of fan 31 being to direct cooling fluid (here, air) onto the test coupons and holding test fixtures to cause the retained coupons to reach a first low temperature prior to the application of electrical current there-across. Significantly, fan 31 draws cold air from second chamber 21 in which the air is cooled down through at least one vent 33 and then across the lower portion of chamber 19 directly onto coupons 13 (the pivotal movement indicated by the arrow "C"). To assure maximum cooling fluid onto the coupons during the cooling cycle, while also substantially shielding the coupons from unnecessary air flow during the heating cycle, a pivotal shield-cover 37 is also positioned on the base. Cover 37 is substantially vertically positioned during manual insertion of coupons in test fixture, and then manually pivoted downwardly (the pivotal movement indicated by the arrow "C") so as to be positioned directly over the projecting portions of coupons 13 for the test duration. In this substantially horizontal position (as shown in solid in FIG. 1), cooling air is concentrated in the area between the cover and the lower panel of housing 11 during the cooling cycle when fan 31 is on. It thus passes in direction "A" before turning vertical after passing over both coupons and holding fixtures. The air then is directed through an outlet vent 39 located in the upper wall of first chamber 19 at a spaced location from inlet vent 33.

The cooling fluid (in this case, air) is cooled using refrigeration structure similar to that used in household refrigerators, with evaporator cooling tubing 40 extending within the upper chamber 21 such that the fluid will pass through and around the tubing 40. Chamber 21 also contains heating elements, such as used in a standard convection oven. A thermostat (not shown) is used to set the first chamber's initial temperature, alternately employing heating or cooling in chamber 21 as necessary to condition the air and achieve the prescribed target temperature in the first chamber 19. Finally, chamber 21 includes at least one circulating fan (not shown, for ease of illustration), which runs continuously as long as apparatus 11 is powered on to force conditioned air down through vent 33 and return it through vent 39. In addition, these fans within the upper chamber 21 are designed to create sufficient turbulent air flow within lower chamber 19 in order to heat or cool the entire chamber as well as all articles placed inside of it. Other supporting devices for the heating and cooling system, such as are part of standard refrigeration chambers or convection ovens, including but not limited to condensers, compressors, transformers, wiring, and control panels, may be integrated into the back or side of housing 17 or be part of a separate housing. Alternative cooling structures may also be used for this purpose, the invention not being limited to this particular version.

In operation, the apparatus operator opens the doors 23, pulls out movable base 25, vertically orients shield-cover 37 (to fully expose the test fixtures 27), positions the coupons 13 in the respective test fixtures 27, attaches thermocouples 41 (if used, see FIG. 2) to each coupon (or places these very near same), pivotally rotates shield-cover 37 downwardly to cover the projecting coupons 13, and then closes the doors 23 to encase the coupons within first chamber 19. He/she then turns on fan 31 using the software controls of test system 51. He then powers on the first chamber, setting the first chamber temperature using the thermostat, and allows sufficient time for the coupons to reach the first temperature, which, in most cases, is lower than the ambient temperature surrounding the housing, especially if said ambient is normal room temperature. As stated, this first temperature may be as low as −65 degrees C., due to the ability of the cooling structure as defined herein to cool the air to such a low temperature and to direct same across the retained coupons within the enclosed chamber.

Figure 3:
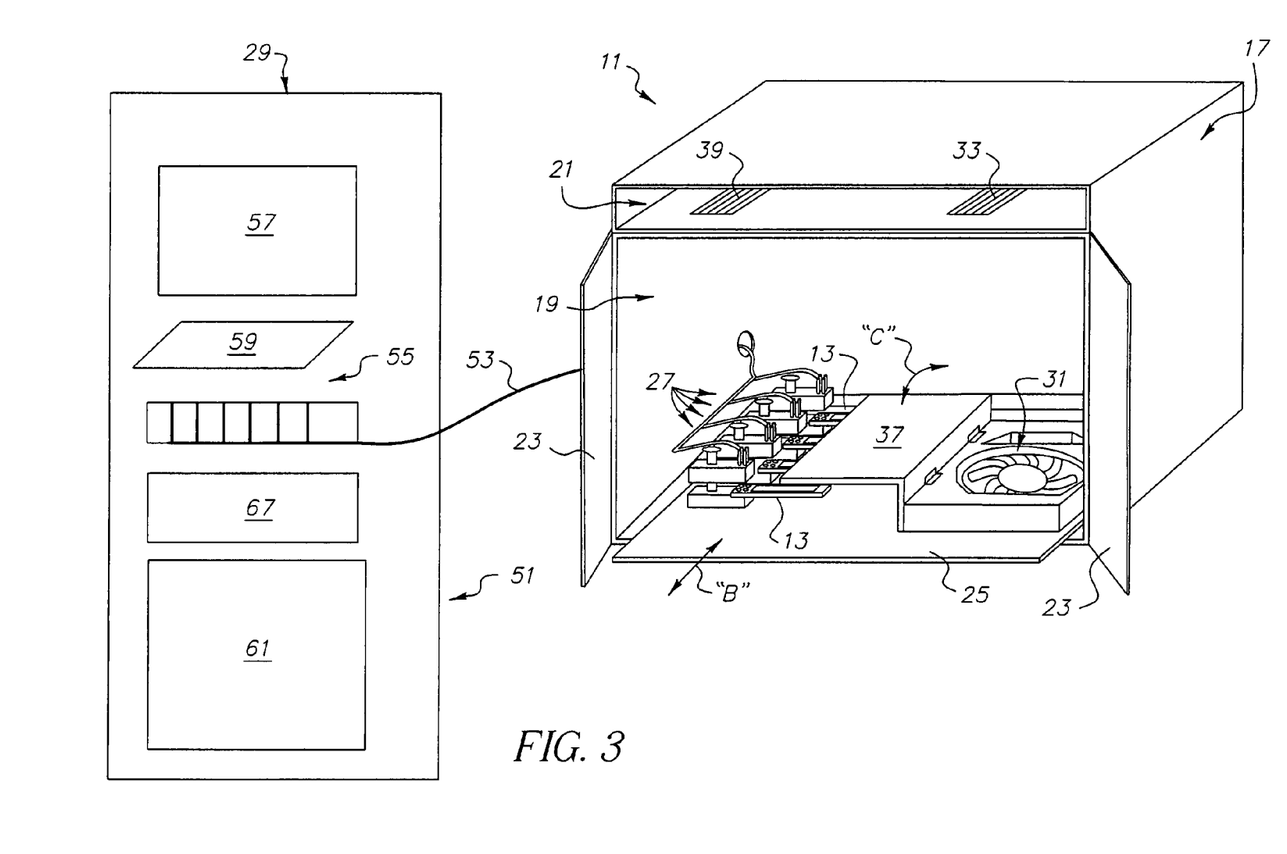
FIG. 3 is a perspective view, on a smaller scale over the view of FIG. 1, showing how the apparatus of FIG. 1 may be operatively coupled to a conventional test system.

As seen in FIG. 3, apparatus 11 is operatively coupled to a test system 51 by cabling 53, which couples each of the test fixtures 27 in housing 17 to the system. System 51 includes the afore-mentioned housing 29 including therein a personal computer system 55, which may be any of the presently commercially available desktop computers, and an associated video monitor 57 and keyboard 59. Though not separately detailed in FIG. 3, computer system 55 generally includes a microprocessor and memory, which allows the computer to access, store and process information, as with any general purpose computer. The memory of the computer includes a combination of RAM and of course the required hard drive. It also includes a floppy and/or CD drive capable of storing software programs which can be run by the computer. Utilizing the components as defined herein, such programming is adapted for programming system 55 to read and store test substrate temperatures (when using a thermocouple for each substrate), voltage changes (especially voltage drops) across the substrates, as well as other desired information necessary to conduct the testing desired herein. During test set-up, the tester may desire, for example, to enter identification numbers for each test coupon, the target high temperature to which the coupons will be heated, the temperature coefficient of resistance for the specific test coupons and temperature range, the desired temperature ranges, and so forth. The tester is also able to provide instruction signals to other components of the system, as desired and if such added components are utilized. Computer system 55 also preferably includes, as such components, a math co-processor, an SVGA graphics adapter, a counter, a clock, and a control board which interfaces the other processing elements of the computer system. Such components are well known in the computer industry and further description is not deemed necessary, nor is it deemed necessary to fully illustrate each and every one. Obviously, the monitor and keyboard are oriented for easy access and viewing, as are the computer's slots for receiving the software programs. Housing 29 also includes the necessary power supplies 61 for simultaneously providing current to the respective test fixtures using cabling 53. Housing 29 also includes at least one micro-voltmeter 67 for measuring voltage drop across test coupon resistances. In one particular embodiment, each power supply may be a Model 6642A power supply available from Agilent Technologies, Inc., Palo Alto, Calif., and is a programmable power supply such that it can be instructed to output the desired number (in the embodiment shown, four) of specific currents simultaneously. One example of a micro-voltmeter for use herein is a Model 197A, available from Keithly Instruments Inc., Cleveland, Ohio. Generally, the system's micro-voltmeter is coupled to a controller (e.g., via a bus) which in turn serves to multiplex the access of the micro-voltmeter(s) to the four coupons being tested simultaneously to allow the taking of a voltage drop across the first coupon, then the second, and so on. Each reading is transmitted to the computer for storage and processing. Following reading of the four coupons, the controller will re-start the process and a new series of voltage drop readings will be obtained, this time at an elevated temperature for each coupon. As indicated, the power supply(ies) is(are) capable of providing DC electrical current to the four separate coupons simultaneously. Accordingly, because the computer controls the operation of power supply(ies), it causes these to turn off and on in accordance with the program inputted and also to control the amount of current that is provided to each of the test coupons. The computer also operates as a controller for fan 31. When cooling is requested, the system's controller transmits the requisite signal to the fan. The components as defined herein are, for the most part, commercially available, and further description is not considered necessary.

The testing procedure is understood to be conducted until each coupon fails or for a prescribed number of thermal cycles. A first part of each thermal cycle may be called the "hot" cycle during which the tester applies electrical current through each test coupon, once it has reached its desire first temperature. Current is applied at a given heat rate to reach a given target higher temperature for a given heat dwell time. Voltage drop readings are taken according the program's specifications to calculate the coupon resistance and associated estimated temperature (as well as failure, should this occur). Fan 31 is off during this first cycle such that each coupon is "isolated" from the normal forced air flow of any cooling fluid within first chamber 19. During the second part of the thermal cycle, or what may be called the "cold" cycle, fan 31 is turned on and draws chilled air through the inlet vent and across each of the coupons and the test fixtures holding same. Current is reduced significantly to a non-heating level (e.g., 100 milliamps). Voltage readings are again taken to determine the coupon resistance and associated coupon temperature (as well as failure, if this occurs). This "cold" cycle is considered complete when the coupon temperatures (as estimated using resistance and read using the thermocouples) reach equilibrium (no further change in accordance with specified stability criteria). With all readings now in storage, one full thermal cycle is now considered complete. When all samples are failed, or a prescribed number of cycles is attained, then the test is considered over.

Figure 2:
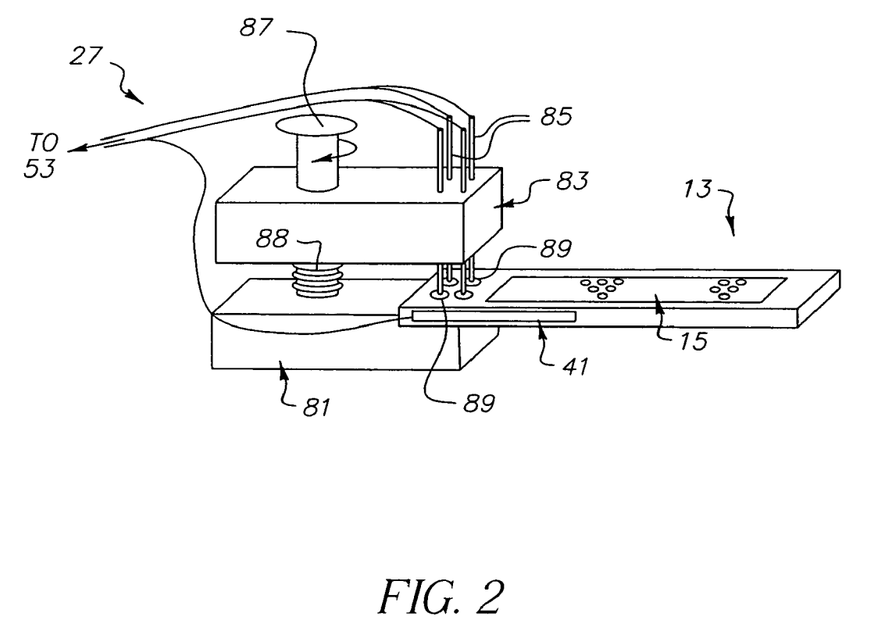
FIG. 2 is a perspective view, enlarged over the view of FIG. 1, showing in greater detail one of the test fixtures adapted for use in the apparatus of FIG. 1.

In FIG. 2, there is shown one embodiment of a test fixture 27 capable of being used in the invention. Fixture 27 includes first and second grip members (portions) 81 and 83 designed for gripping and holding a test coupon 13 therebetween. Members 81 and 83 are preferably comprised of a polymer material. Spring contact probes 85 are positioned within the upper (second) grip portion and electrically coupled at one end to selected ones of the cabling 53. A screw 87 is used to lock the two grip portions together, while a spring 88 exerts tension to attempt to force the grip portions apart. Probes 85 engage respective conductors 89 (e.g., flat copper pads) formed on the coupon's upper surface, and coupled via one or more circuit planes within or atop the coupon, depending on the number of conductive layers and associated thru-holes of the coupon. Probes 85 pass through the upper grip portion and engage the conductors as shown. Understandably, it is through these conductors that the test fixture is able to access the coupon's heat and voltage sense lines. Further, the thermocouple, shown as taped along side the coupon, enables the coupon's temperature to be read in the manner defined above. It is understood that added readings are possible, depending on the number and type of parameters desired for reading. The components identified herein are representative of those most desired and are not meant to limit the invention.

Thus there has been shown and described a new and unique test apparatus and method for testing circuitized substrates such as test coupons for larger, associated PCBs. The invention is able to do so while establishing the substrate temperatures at an initial temperature much different than the ambient temperature normally used for known such testers to thus assure more precise readings relative to the conditions under which the associated PCB may be exposed. The invention uses, for the most part, conventional elements and is thus relatively inexpensive to produce. It is also understood from the description herein that the apparatus is relatively easy to operate. Other advantages of the invention are readily discernible from the other teachings provided herein.

While there have been shown and described what are at present the preferred embodiments of the invention, it will be obvious to those skilled in the art that various changes and modifications may be made therein without departing from the scope of the invention as defined by the appended claims.

What is claimed is:

1. An apparatus for testing at least one substrate, said apparatus comprising:
   a housing including first and second chambers, said second chamber located above said first chamber and adapted for having cooling fluid pass there-through;

at least one test fixture positioned substantially within said first chamber and adapted for holding at least one test substrate having a plurality of conductive thru-holes therein within said first chamber, said at least one test fixture adapted for being electrically coupled to said at least one test substrate within said first chamber;

cooling structure for directing said cooling fluid from said second chamber onto said at least one test fixture and said at least one test substrate when said at least one test fixture is holding said at least one test substrate so as to cool said at least one substrate to a first test temperature lower than normal ambient room temperature within said first chamber, said cooling structure including a fan located within said first chamber for drawing said cooling fluid from said second chamber and onto said at least one test fixture and said at least one test substrate;

electrical supply means for supplying electrical current to said test fixture and said plurality of thru-holes within said at least one test substrate to heat said test substrate to a second test temperature greater than said first test temperature; and a test system for testing said at least one test substrate within said at least one test fixture when said electrical supply means supplies said electrical current to said at least one test fixture and said plurality of thru-holes within said at least one test substrate.

2. The apparatus of claim 1 wherein said test fixture includes first and second grip portions for gripping said at least one test substrate there-between, said second grip portion being electrically coupled to said at least one test substrate.

3. The apparatus of claim 2 wherein said second grip portion includes a plurality of spring contacts as part thereof, said spring contacts adapted for being electrically coupled to respective ones of said plurality of said thru-holes of said at least one test substrate.

4. The apparatus of claim 1 wherein said housing includes a panel, said apparatus further including a movable cover member adapted for substantially covering said at least one test substrate when said fan of said cooling structure directs said cooling fluid onto said test fixture and said at least one test substrate, said movable cover concentrating said cooling fluid in an area between said movable cover and said panel of said housing.

5. The apparatus of claim 1 wherein said electrical supply means for supplying electrical current to said test fixture and said plurality of thru-holes within said at least one test substrate to heat said test substrate comprises a power supply.

6. The apparatus of claim 1 wherein said test system comprises said electrical supply means for supplying electrical current to said at least one test fixture and said plurality of thru-holes within said at least one test substrate to heat said at least one test substrate, voltage sensing devices for measuring the voltage across said at least one test substrate when said electrical supply means supplies said electrical current to said at least one test substrate, a computer, and software for said computer adapted for being programmed according to established test substrate temperatures, test substrate voltage readings and other information relating to said test substrates.

7. The apparatus of claim 1 wherein said first test temperature is within the range of from about −65 degrees Celsius to about 150 degrees Celsius.

8. The apparatus of claim 1 further including at least one thermocouple adapted for being positioned on or near said at least one test substrate to measure the temperature of said at least one test substrate when said electrical supply means supplies said electrical current to said test fixture and said plurality of thru-holes within said at least one test substrate to heat said at least one test substrate.

9. The apparatus of claim 1 wherein said cooling structure for directing cooling fluid onto said at least one test fixture when said at least one test fixture is holding said at least one test substrate so as to cool said substrate to a first test temperature lower than said normal ambient room temperature within said first chamber further comprises refrigeration tubing located substantially within said second chamber of said housing for cooling said cooling fluid when said cooling fluid passes through said second chamber.

10. A method of testing at least one substrate, said method comprising:

positioning at least one test substrate having a plurality of conductive thru-holes therein within a test fixture positioned substantially within a first chamber of a housing including first and second chambers wherein said second chamber is located above said first chamber and is adapted for having cooling fluid pass therethrough;

electrically coupling said plurality of conductive thru-holes within said at least one test substrate to said test fixture within said first chamber of said housing;

directing said cooling fluid from said second chamber onto said at least one test fixture and said at least one test substrate within said first chamber when said at least one test substrate is positioned within said at least one test fixture so as to cool said at least one test substrate to a first test temperature lower than normal ambient room temperature within said first chamber of said housing;

supplying electrical current to said test fixture and said plurality of thru-holes within said at least one test substrate to heat said test substrate to a second test temperature greater than said first test temperature; and testing said at least one test substrate within said at least one test fixture when said electrical supply means supplies said electrical current to said at least one test fixture and said plurality of thru-holes within said at least one test substrate.

11. The method of claim 10 wherein said electrically coupling of said plurality of conductive thru-holes within said at least one test substrate to said at least one test fixture within said first chamber of said housing is accomplished using a plurality of spring contacts.

12. The method of claim 10 wherein said directing of said cooling fluid onto said test fixture and onto said at least one test substrate when said at least one test substrate is positioned within said test fixture so as to cool said at least one test substrate to a first test temperature lower than the ambient temperature surrounding said housing is accomplished using a fan positioned within said first chamber.

13. The method of claim 12 wherein said directing of said cooling fluid onto said test fixture and onto said at least one test substrate when said at least one test substrate is positioned within said at least one test fixture so as to cool said at least one test substrate to a first test temperature lower than said normal ambient room temperature within said first chamber is further accomplished using refrigeration tubing located substantially within said second chamber of said housing for cooling said cooling fluid when said cooling fluid passes through said second chamber.

14. The method of claim 10 wherein said supplying of said electrical current to said at least one test fixture and said plurality of thru-holes within said at least one test substrate to heat said at least one test substrate is accomplished using a power supply.

15. The method of claim 10 wherein said testing said at least one test substrate includes measuring the voltage across said at least one test substrate when said electrical supply means supplies said electrical current to said at least one test substrate.

* * * * *